United States Patent
Chen et al.

(10) Patent No.: US 11,236,421 B2
(45) Date of Patent: Feb. 1, 2022

(54) ATOMIC LAYER DEPOSITION DEVICE FOR MASSIVELY COATING MICRO-NANO PARTICLES

(71) Applicant: Huazhong University of Science and Technology, Hubei (CN)

(72) Inventors: Rong Chen, Hubei (CN); Jiawei Li, Hubei (CN); Bin Shan, Hubei (CN); Xiao Liu, Hubei (CN); Kai Qu, Hubei (CN); Jing Zhang, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 274 days.

(21) Appl. No.: 16/615,060

(22) PCT Filed: Apr. 15, 2019

(86) PCT No.: PCT/CN2019/082668
§ 371 (c)(1),
(2) Date: Nov. 19, 2019

(87) PCT Pub. No.: WO2019/237820
PCT Pub. Date: Dec. 19, 2019

(65) Prior Publication Data
US 2021/0332478 A1   Oct. 28, 2021

(30) Foreign Application Priority Data
Jun. 14, 2018   (CN) .......................... 201810614134.0

(51) Int. Cl.
*C23C 16/40*  (2006.01)
*C23C 16/44*  (2006.01)
(Continued)

(52) U.S. Cl.
CPC .... *C23C 16/4417* (2013.01); *C23C 16/45544* (2013.01); *C23C 16/52* (2013.01)

(58) Field of Classification Search
CPC ..... B82Y 40/00; C23C 16/4417; C23C 16/52; C23C 16/45544
(Continued)

(56) References Cited

U.S. PATENT DOCUMENTS 6,004,396 A * 12/1999 Ishikawa ................. H01L 24/75
                                                                 118/715
6,055,928 A *  5/2000 Murzin ................... C23C 14/48
                                                                 118/723 AN (Continued)

FOREIGN PATENT DOCUMENTS

CN   204058588 U   12/2014
CN   108715998 A   10/2018

OTHER PUBLICATIONS

International Search Report and Written Opinion issued in PCT/CN2019/082668, dated Jun. 25, 2019, 10 pages provided.

*Primary Examiner* — Rudy Zervigon
(74) *Attorney, Agent, or Firm* — Hamre, Schumann, Mueller & Larson, P.C.

(57) ABSTRACT

An atomic layer deposition device for massively coating micro-nano particles, includes a reaction chamber and a particle container, in which an inlet port is provided at a lower end of the reaction chamber, and an inlet pipe for introducing a precursor or a carrier gas is provided in the inlet port; a chamber door is provided at an upper end of the reaction chamber, so that the particle container can be freely placed in or removed out of the reaction chamber; an air inlet hole is provided at a lower end of the particle container, and the inlet pipe enters the particle container through the air inlet hole.

5 Claims, 2 Drawing Sheets

(51) Int. Cl.
*C23C 16/455* (2006.01)
*C23C 16/52* (2006.01)

(58) Field of Classification Search
USPC ........ 118/715, 724, 725; 156/345.33, 345.34
See application file for complete search history.

(56) References Cited

U.S. PATENT DOCUMENTS

| | | | |
|---|---|---|---|
| 6,335,268 B1* | 1/2002 | Murzin | C23C 14/48 438/370 |
| 9,732,425 B2* | 8/2017 | Park | C04B 35/62802 |
| 2014/0174540 A1 | 6/2014 | Cheng | |
| 2015/0075429 A1* | 3/2015 | Park | C23C 16/45502 118/719 |

* cited by examiner

ATOMIC LAYER DEPOSITION DEVICE FOR MASSIVELY COATING MICRO-NANO PARTICLES

BACKGROUND

Technical Field

The disclosure belongs to the field of atomic layer deposition preparation instruments, and more particularly relates to an atomic layer deposition device for massively coating micro-nano particles.

Description of the Related Art

Micro-nano-sized granular materials have, due to their relatively large specific surface area compared with common materials, different physicochemical properties from particles on a general macroscopic scale, and are widely used in multiple fields such as fuels, coatings, electronics and catalysts. However, micro-nano particles have disadvantages such as easy agglomeration and oxidation. Therefore, it is considered to coat the surface of the particles with a protective film to overcome the above defects. At present, methods for coating particles generally include a solid phase method, a liquid phase method and a vapor phase method, in which atomic layer deposition is a special chemical vapor deposition method, which has excellent uniformity and controllability compared with other deposition techniques.

However, further researches indicate that there are still following defects or deficiencies in the prior art: firstly, at present, atomic deposition techniques are generally applied only to the coating of planar substrates, and there are insufficient researches on the coating of particles, especially micro-nano particles; and secondly and more importantly, it is found in practice that the large specific surface area of the micro-nano particles may easily lead to agglomeration, and conventional atomic layer deposition equipment or methods have difficulty in uniform and complete coating of the micro-nano particles and must consume a large amount of precursors during the deposition process, resulting in the difficulty in mass industrialized production, as well as problems such as inconvenient handling and difficulty in accurately obtaining desired indexes. Accordingly, there is an urgent need in the art for further research and improvement to better meet the mass and high-quality atomic layer deposition requirements in modern micro-nanoparticle coatings

SUMMARY

In view of the above-described defects or improvement requirements in the art, the disclosure provides an atomic layer deposition device for massively coating micro-nano particles, in which through redesigning of the entire structural layout of the device, as well as improvements on specific structures and mutual arrangement modes of multiple key components (e.g., a particle container and a reaction chamber), designing of key parameters of the whole process reaction route, etc., the deposition quality of the micro-nano particles can be significantly improved by fully utilizing the mechanism of combining the inner circulation and the outer circulation of the gas flow, while achieving rapid temperature rise and improved reaction efficiency, as well as advantages such as mass processing, higher utilization rate of the precursor and more uniform and complete coating. Therefore, the disclosed atomic layer deposition device is especially suitable for mass industrialized coating of micro-nano particles.

In order to achieve the above objective, according to an aspect of the disclosure, there is provided an atomic layer deposition device for massively coating micro-nano particles, in which the device includes a reaction chamber with a cylindrical vertical structure, and a particle container coaxially sleeved in the reaction chamber.

Wherein the reaction chamber comprises an inlet port provided at a lower end thereof, a chamber door and a flange interface provided at an upper end thereof, a lead-in electrode provided at a side thereof, and a heating belt provided in an inner chamber thereof, wherein the inlet port is sealingly mounted with an inlet pipe for introducing a precursor or a carrier gas, and the flange interface is connected to a vacuum pump for providing a desired vacuum environment for the inner chamber of the reaction chamber; the chamber door is interconnected with the upper end of the reaction chamber, and is equipped with a preloading unit for performing preloading when the chamber door is closed; the lead-in electrode is configured to be connected to an external power source and supply power to the heating belt, so that the heating belt heats the inner chamber of the reaction chamber; the reaction chamber is also equipped with a vacuum gauge for monitoring a real-time air pressure value of the inner chamber in the vacuum environment, a first thermocouple for monitoring a real-time temperature value of the inner chamber, and a second thermocouple for monitoring a real-time temperature value of the heating belt.

The particle container is a sealed cylindrical body formed by sequentially connecting a container upper cover, a container barrel, a container lower cover and a support barrel from top to bottom, wherein the container upper cover is provided with a handle for placing the entire particle container in the reaction chamber or removing the entire particle container out of the reaction chamber; a filter screen is provided between the container upper cover and the container barrel, and a second filter screen is provided between the container barrel and the container lower cover, both the first and second filter screens enabling the passage of the precursor or carrier gas while blocking the passage of the micro-nano particles; the container lower cover and the support barrel are connected up and down by a wedge structure, with a certain transition space left; a chamber inner pipe is provided inside the support barrel in a vertical direction to controllably communicate with the inlet pipe so as to introduce the predetermined precursor or carrier gas into the container barrel; a riser is also provided inside the container barrel in a vertical direction, with a bottom end of the riser opposed to a top end of the chamber inner pipe, and the riser is configured to generate up-and-down convection to drive the micro-nano particles to roll during the introduction of the precursor, thereby increasing the collision between the particles and the contact probability of the particles with the precursor.

Further, the chamber door is hinged to the upper end of the reaction chamber via a first hinge pin and a gas spring, and the lead-in electrode is interconnected with the heating belt via a second hinge pin.

Further, a first heat shield is mounted in the reaction chamber, and a second heat shield is mounted in the chamber door, thereby enabling heat preservation of the inner chamber of the reaction chamber after being heated by the heating belt.

Further, each of the first and second filter screens has a pore diameter of 5 µm to 50 µm, and a mesh size of 400 mesh to 3000 mesh.

Further, a gas flow rate of the precursor or carrier gas introduced into the reaction chamber is set to 50 sccm to 5 slm.

Further, a mass of the micro-nano particles placed once in the particle container is set to 20 g to 800 g.

According to another aspect of the disclosure, there is further provided a corresponding atomic layer deposition method, comprising the following steps.

S1: placing the micro-nano particles in a particle container, and respectively sealing upper and lower ends of the particle container by a first filter screen and a second filter mesh; then, opening a chamber door of a reaction chamber, and placing the entire particle container into the reaction chamber; closing the chamber door, preloading the chamber door by a preloading unit, and then turning on a vacuum pump to evacuate the reaction chamber so that a pressure of the inner chamber is controlled to be 100 Pa or less.

S2: controlling a flow rate of a carrier gas in a range of 50 sccm to 5 slm by a mass flow controller, and introducing the carrier gas into the particle container through a chamber inner pipe, so that the micro-nano particles continuously roll and collide under the gas flow fluidization, thereby promoting uniform dispersion of the particles and achieving deagglomeration.

S3: setting a target temperature through a temperature controller, and keep the temperature stable after the inner chamber of the reaction chamber to reach the target temperature, so that the subsequent reaction is carried out at the stable temperature;

S4: opening a first precursor valve to continuously introduce a first precursor into the particle container, and maintaining the flow rate of the carrier gas, so that the inner circulation flow of the precursor is achieved by a riser within the particle container, thereby promoting the full contact reaction between the precursor and the micro-nano particles and improving the utilization rate of the precursor; meanwhile, keeping the vacuum pump in a working state, so that the reacted low-concentration precursor is discharged through the outer circulation, thereby promoting the rapid entry of the newly entered precursor into the particle container and increasing the contact reaction rate between the precursor and the micro-nano particles.

S5: closing the first precursor valve, and continuously supplying the carrier gas for a certain period of time, so that under the action of the purging of the carrier gas and the evacuation of the vacuum pump, the excess first precursor accumulated on the particles and the first precursor remaining in the container are discharged.

S6: opening a second precursor valve to introduce the second precursor into the particle container; meanwhile, keeping the vacuum pump in a working state, and maintaining the flow rate of the carrier gas, thereby prompting the rapid diffusion of the second precursor into the particle container, so that the second precursor chemically reacts with the first precursor on the micro-nano particle to form a sub-nanometer film, and after a period of time, the resulting film will completely cover the surface of the micro-nanoparticle;

S7: closing the second precursor valve, and continuously supplying the carrier gas for a certain period of time, so that under the action of the purging of the carrier gas and the evacuation of the vacuum pump, the excess second precursor accumulated on the particles and the second precursor remaining in the container are discharged.

S8: repeatingly performing S4 to S7, so that the two precursors are alternately reacted, and a coating film with a desired thickness can be accurately obtained by controlling a number of cycles of the reaction.

In general, by comparing the above technical solution of the present inventive concept with the prior art, the present disclosure has the following beneficial effects.

1. Through redesigning of the entire structural layout of the device, as well as improvements on specific structures and mutual arrangement modes of multiple key components (e.g., a particle container and a reaction chamber), the rapid temperature rise can be achieved, thereby significantly improving the efficiency and controllability of the whole process, and the micro-nano particles placed inside the particle container continuously and circularly roll under the action of combining the outer air circulation and the inner air circulation, thereby promoting the full contact reaction between the precursor and the micro-nano particles and improving the utilization rate of the precursor.

2. The disclosure further optimizes the designing of the process steps in the whole process, especially key process parameters that directly affect the final deposition effect, and many practical tests show that a better deposition effect can be achieved in the disclosure compared with the prior art, with the advantages such as large batch processing amount, high reaction rate, more uniform and complete coating and good shape retention.

3. The deposition device according to the disclosure has a compact structure, is easy to handle, and not only greatly reduces the difficulty in coating process of the micro-nanoparticle powder and the like, but also solves the technical problem that the micro-nano particles are easily agglomerated during the deposition process. Therefore, the atomic layer deposition device provided by the disclosure is especially suitable for mass industrialized coating of micro-nano particles.

DETAILED DESCRIPTION OF THE EMBODIMENTS

For clear understanding of the objectives, features and advantages of the present disclosure, detailed description of the present disclosure will be given below in conjunction with accompanying drawings and specific embodiments. It should be noted that the embodiments described herein are only meant to explain the present disclosure, and not to limit the scope of the present disclosure. Furthermore, the technical features related to the embodiments of the disclosure described below can be mutually combined if they are not found to be mutually exclusive.

Figure 1:
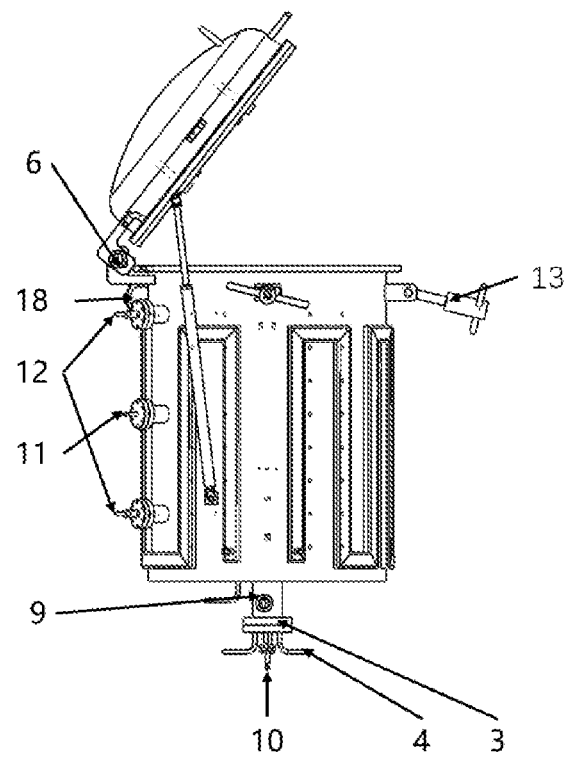
FIG. 1 is a side view showing the entire configuration of an atomic layer deposition device according to the disclosure.
Figure 2:
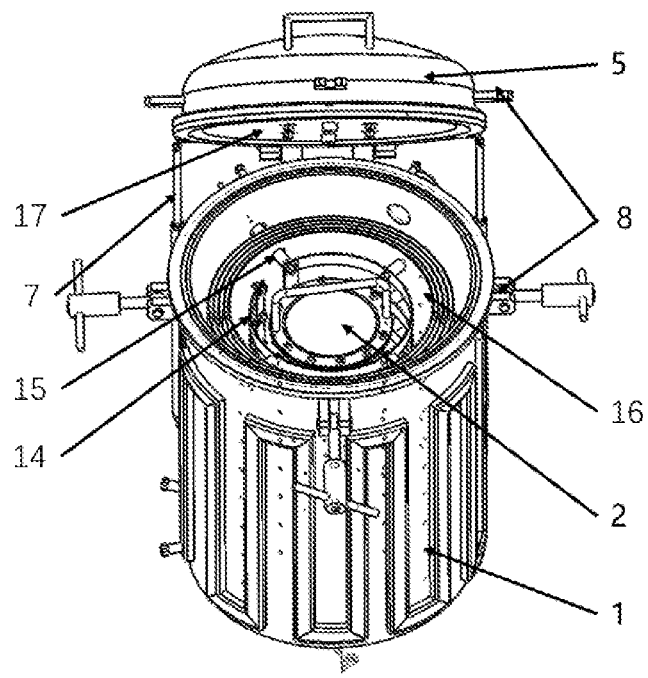
FIG. 2 is an end view showing the entire configuration of the atomic layer deposition device according to the disclosure.
Figure 3:
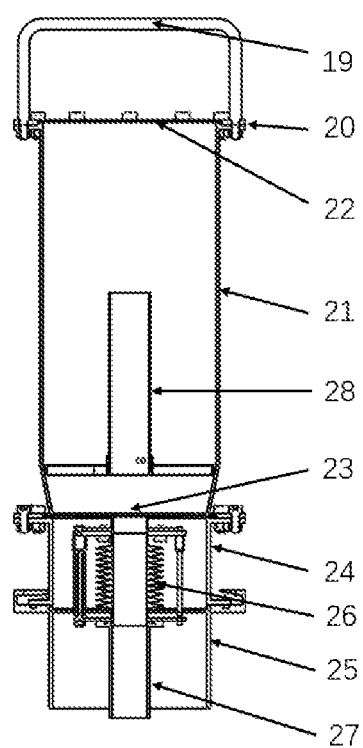
FIG. 3 is a sectional view showing the structure of the particle container shown in FIG. 1 in more detail.

FIG. 1 is a side view showing the entire configuration of an atomic layer deposition device according to the disclosure, and FIG. 2 is an end view showing the entire configuration of the atomic layer deposition device according to the disclosure. As shown in FIG. 1 and FIG. 2, the atomic layer deposition device is specially designed for a coating process of large-scale micro-nano particles, and mainly includes main components such as a reaction chamber 1 and a particle container 2 which are coaxially sleeved together, and the main components will be specifically described one by one below.

For the reaction chamber 1, it preferably has a cylindrical vertical structure, with a particle container 2 also having a cylindrical vertical structure coaxially sleeved therein, and includes an inlet port 3 provided at a lower end thereof, a chamber door 5 and a flange interface 18 provided at an upper end thereof, a lead-in electrode 12 provided at a side thereof, a heating belt 14 provided in an inner chamber thereof, and so on. Specifically, the inlet port 3 is sealingly mounted with an inlet pipe 4 for introducing a precursor or a carrier gas, and the flange interface is connected to a vacuum pump for providing a desired vacuum environment for the inner chamber of the reaction chamber; the chamber door 5 is interconnected with the upper end of the reaction chamber, and is equipped with a preloading unit 13 for performing preloading when the chamber door 5 is closed; the lead-in electrode 12 is configured to be connected to an external power source and supply power to the heating belt 14, so that the heating belt heats the inner chamber of the reaction chamber; and the reaction chamber is also equipped with a vacuum gauge 9 for monitoring a real-time air pressure value of the inner chamber in the vacuum environment, a first thermocouple 10 for monitoring a real-time temperature value of the inner chamber, and a second thermocouple 11 for monitoring a real-time temperature value of the heating belt.

In other words, the reaction chamber is mainly configured to provide an environment with certain temperature and pressure. The flange interface is provided on the upper side of the reaction chamber and connected to the vacuum pump to provide a vacuum environment for the inner chamber. A heating belt and a heat shield are also provided inside the reaction chamber to heat the inner chamber and achieve heat preservation, so that the inner chamber is finally kept at a certain temperature. In addition, the reaction chamber is mounted with a lead-in electrode for supplying power to the heating belt, a vacuum gauge for monitoring an air pressure of the inner chamber, a first thermocouple for monitoring a temperature of the inner chamber, and a second thermocouple for monitoring a temperature of the heating belt. The chamber door is mainly configured to open and close the inner chamber to facilitate the placement and removal of the particle container. The chamber door is connected to the reaction chamber via a first hinge pin and a gas spring, thereby achieving convenient opening and closing. The chamber door is preliminarily sealed with the reaction chamber by a preloading unit mounted on the reaction chamber. A water-cooling pipe is provided on the chamber door and the reaction chamber to prevent the overheat deformation of the gasket, thereby ensuring the sealing reliability.

For the particle container 2, it preferably is a sealed cylindrical body formed by sequentially connecting a container upper cover 20, a container barrel 21, a container lower cover 24 and a support barrel 25 from top to bottom, in which the container upper cover 20 may be provided with a handle 19 for placing the entire particle container in the reaction chamber or removing the entire particle container out of the reaction chamber; a filter screen 22 is provided between the container upper cover 20 and the container barrel 21, and a second filter screen 23 is provided between the container barrel 21 and the container lower cover 24, both the first and second filter screens enabling the passage of the precursor or carrier gas while blocking the passage of the micro-nano particles; the container lower cover 24 and the support barrel 25 are connected up and down by a wedge structure, with a certain transition space left; a chamber inner pipe 27 is provided inside the support barrel 25 in a vertical direction to controllably communicate with the inlet pipe 4 of the reaction chamber 1 so as to introduce the predetermined precursor or carrier gas into the container barrel 21; a riser 28 is provided inside the container barrel 21 in a vertical direction, with a bottom end of the riser 21 opposed to a top end of the chamber inner pipe 27, and the riser is configured to generate up-and-down convection to drive the micro-nano particles to roll during the introduction of the precursor, thereby increasing the collision between the particles and the contact probability of the particles with gas molecules.

In other words, the particle container is mainly configured to accommodate micro-nano particles and serve as a main deposition area for atomic layer deposition. The upper and lower ends of the particle container are sealed by filter screens with a certain mesh size to prevent micro-nano particles from leaking out of the particle container, while enabling the flow of the precursor and carrier gas into the particle container and the flow of the reaction product out of the particle container. By providing a riser in the particle container, the inner circulation of the gas flow in the particle container can be realized, so that the reaction rate and the utilization rate of the precursor can be effectively improved, and the batch processing amount of the micro-nano particles can be improved. In terms of specific assembly, for example, the handle 19 can be connected to the container upper cover 20 and the container barrel 21 via by bolts and nuts, the first filter screen 22 may be can be fastened between the container upper cover 20 and the container barrel 21 by bolts and nuts, and the second filter screen 23 may be can be fastened between the container barrel 21 and the container lower cover 24 by bolts and nuts. The container lower cover 24 is connected to the support barrel 25 in the reaction chamber 2 by a wedge structure. A bellows 26 is placed in the container lower cover 24 and is connected to the chamber inner pipe 27. The riser 28 is placed in the container barrel 21.

Through the above concept, compared with the conventional equipment, the atomic layer deposition device provided by the disclosure is designed to allow a heating belt to be placed in the reaction chamber, thereby achieving rapid temperature rise and reducing waiting time. In addition, the combination of the inner circulation and the outer circulation is introduced into a conventional deposition system, in which the particle container is placed in a vacuum chamber, the precursor and carrier gas are introduced into the particle container, and the gas flow rate is controlled to generate an inner circulation gas flow in the particle container, so that the micro-nano particles can continuously and circularly roll in the container. By combining the inner circulation and the outer circulation of the gas flow, the collision between the particles and the contact probability of the particles with the gas molecules can be increased so that the reaction rate and the utilization rate of the precursor is improved, and mass high-quality and high-efficiency coating of micro-nano particles are achieved, while featuring controllable thickness and good shape retention.

In accordance with a preferred embodiment of the disclosure, the purpose of the riser 28 being placed within the container barrel 21 is to conduct the flow. Through the riser 28, an inner circulation gas flow can be formed in the container barrel, thereby improving the utilization rate of the precursor and causing the micro-nano particles to continuously collide to achieve the deagglomeration effect. Correspondingly, it is designed that the first screen 22 and the second screen 23 preferably have a pore diameter of 5 μm to 50 μm, and are configured to enable the passage of the precursor and block the passage of the micro-nano particles, so that the micro-nanoparticles react in the particle container. The lead-in electrode 12 is configured to be connected to an external power source and supply power to the heating belt, the first thermocouple 10 is configured to monitor an internal temperature of the reaction chamber, and the second thermocouple 11 is configured to monitor a temperature of the heating belt.

Furthermore, in accordance with another preferred embodiment of the disclosure, the shape and size of the reaction chamber 1 are such that the reaction chamber can accommodate the particle container 2, the heating belt 14 and the first heat shield 16, and is as small as possible to reduce the swept volume and improve the utilization rate of the precursor as much as possible. Therefore, it is preferable that the reaction chamber adopts a cylindrical vertical structure, and the chamber door 5 is selected to be circular. Compared with a rectangular door, a circular door is easier to manufacture and its seal groove is also easier to machine. Since the device has a working temperature lower than 300° C. and a small heat load, the sealing portions are cooled by means of a welded water pipe.

The working principle of the atomic layer deposition device according to the disclosure will be specifically described below.

S1: placing the micro-nano particles in a particle container, and respectively sealing upper and lower ends of the particle container by a first filter screen and a second filter mesh; then, opening a chamber door of a reaction chamber, and placing the entire particle container into the reaction chamber; closing the chamber door, preloading the chamber door by a preloading unit, and then turning on a vacuum pump to evacuate the reaction chamber so that a pressure of the inner chamber is controlled to be 100 Pa or less.

S2: controlling a flow rate of a carrier gas in a range of 50 sccm to 5 slm by a mass flow controller, and introducing the carrier gas into the particle container through a chamber inner pipe, so that the micro-nano particles continuously roll and collide under the gas flow fluidization, thereby promoting uniform dispersion of the particles and achieving deagglomeration.

S3: setting a target temperature through a temperature controller, and keep the temperature stable after the inner chamber of the reaction chamber to reach the target temperature, so that the subsequent reaction is carried out at the stable temperature;

S4: opening a precursor valve to continuously introduce a first precursor into the particle container, and maintaining the flow rate of the carrier gas, so that the inner circulation flow of the precursor is achieved by a riser within the particle container, thereby promoting the full contact reaction between the precursor and the micro-nano particles and improving the utilization rate of the precursor; meanwhile, keeping the vacuum pump in a working state, so that the reacted low-concentration precursor is discharged through the outer circulation, thereby promoting the rapid entry of the newly entered precursor into the particle container and increasing the contact reaction rate between the precursor and the micro-nano particles.

S5: closing the first precursor valve, and continuously supplying the carrier gas for a certain period of time, so that under the action of the purging of the carrier gas and the evacuation of the vacuum pump, the excess first gas molecule accumulated on the particles and the first gas molecule remaining in the container are discharged.

S6: opening a precursor valve to introduce the second precursor into the particle container; meanwhile, keeping the vacuum pump in a working state, and maintaining the flow rate of the carrier gas, thereby prompting the rapid diffusion of the second precursor into the particle container, so that the second precursor chemically reacts with the first precursor on the micro-nano particle to form a sub-nanometer film, and after a period of time, the resulting film will completely cover the surface of the micro-nanoparticle;

S7: closing the second precursor valve, and continuously supplying the carrier gas for a certain period of time, so that under the action of the purging of the carrier gas and the evacuation of the vacuum pump, the excess second gas molecule accumulated on the particles and the second gas molecule remaining in the container are discharged.

S8: repeatingly performing S4 to S7, so that the two precursors are alternately reacted, and a coating film with a desired thickness can be accurately obtained by controlling a number of cycles of the reaction.

In summary, in the atomic layer deposition device provided by the disclosure, a heating belt is placed in the reaction chamber, thereby achieving rapid temperature rise and reducing waiting time. In addition, through introducing the combination of the inner circulation and the outer circulation into a conventional deposition system, a previously static or single-fluidized deposition device is changed to a fluidization device having a specific gas flow distribution, thereby effectively increasing the reaction rate and the utilization rate of the precursor, and achieving mass, uniform and complete coating of the micro-nano particles. In addition, ubiquitous defects the existing devices such as small batch processing amount, low precursor utilization rate, and easy agglomeration of micro-nanoparticles in the reaction chamber are also overcome in the disclosure, so that the article coating layer has the advantages of uniform coating, controllable thickness and good shape retention. Therefore, the atomic layer deposition device provided by the disclosure is especially suitable for mass industrialized coating of micro-nano particles.

It should be readily understood to those skilled in the art that the above description is only preferred embodiments of the present disclosure, and does not limit the scope of the present disclosure. Any change, equivalent substitution and modification made without departing from the spirit and scope of the present disclosure should be included within the scope of the protection of the present disclosure.

What is claimed is:

1. An atomic layer deposition device for massively coating micro-nano particles, wherein the device comprises a reaction chamber with a cylindrical vertical structure, and a particle container coaxially sleeved in the reaction chamber, wherein the reaction chamber comprises an inlet port provided at a lower end thereof, a chamber door and a flange interface provided at an upper end thereof, a lead-in electrode provided at a side thereof, and a heating belt provided in an inner chamber thereof, wherein the inlet port is sealingly mounted with an inlet pipe for introducing a precursor or a carrier gas, and the flange interface is connected to a vacuum pump for providing a desired vacuum environment for the inner chamber of the reaction chamber; the chamber door is interconnected with the upper end of the reaction chamber, and is equipped with a preloading unit for performing preloading when the chamber door is closed; the lead-in electrode is configured to be connected to an external power source and supply power to the heating belt, so that the heating belt heats the inner chamber of the reaction chamber; the reaction chamber is also equipped with a vacuum gauge for monitoring a real-time air pressure value of the inner chamber in the vacuum environment, a first thermocouple for monitoring a real-time temperature value of the inner chamber, and a second thermocouple for monitoring a real-time temperature value of the heating belt; the particle container is a sealed cylindrical body formed by sequentially connecting a container upper cover, a container barrel, a container lower cover and a support barrel from top to bottom, wherein the container upper cover is provided with a handle for placing the entire particle container in the reaction chamber or removing the entire particle container out of the reaction chamber; a first filter screen is provided between the container upper cover and the container barrel, and a second filter screen is provided between the container barrel and the container lower cover, both the first and second filter screens enabling the passage of the precursor or carrier gas while blocking the passage of the micro-nano particles; the container lower cover and the support barrel are connected up and down by a wedge structure, with a certain transition space left; a chamber inner pipe is provided inside the support barrel in a vertical direction to controllably communicate with the inlet pipe so as to introduce the predetermined precursor or carrier gas into the container barrel; a riser is also provided inside the container barrel in a vertical direction, with a bottom end of the riser opposed to a top end of the chamber inner pipe, and the riser is configured to generate up-and-down convection to drive the micro-nano particles to roll during the introduction of the precursor, thereby increasing the collision between the particles and the contact probability of the particles with gas molecules.

2. The atomic layer deposition device according to claim 1, wherein the chamber door is hinged to the upper end of the reaction chamber via a first hinge pin and a gas spring, and the lead-in electrode is interconnected with the heating belt via a second hinge pin.

3. The atomic layer deposition device according to claim 1, wherein a first heat shield is mounted in the reaction chamber, and a second heat shield is mounted in the chamber door, thereby enabling heat preservation of the inner chamber of the reaction chamber after being heated by the heating belt.

4. The atomic layer deposition device according to claim 1, wherein each of the first and second filter screens preferably has a pore diameter of 5 µm to 5 µm, and a mesh size of 400 mesh to 3000 mesh.

5. The atomic layer deposition device according claim 4, wherein a gas flow rate of the precursor or carrier gas introduced into the reaction chamber is set to 50 sccm to 5 slm.

* * * * *